Figure 1:
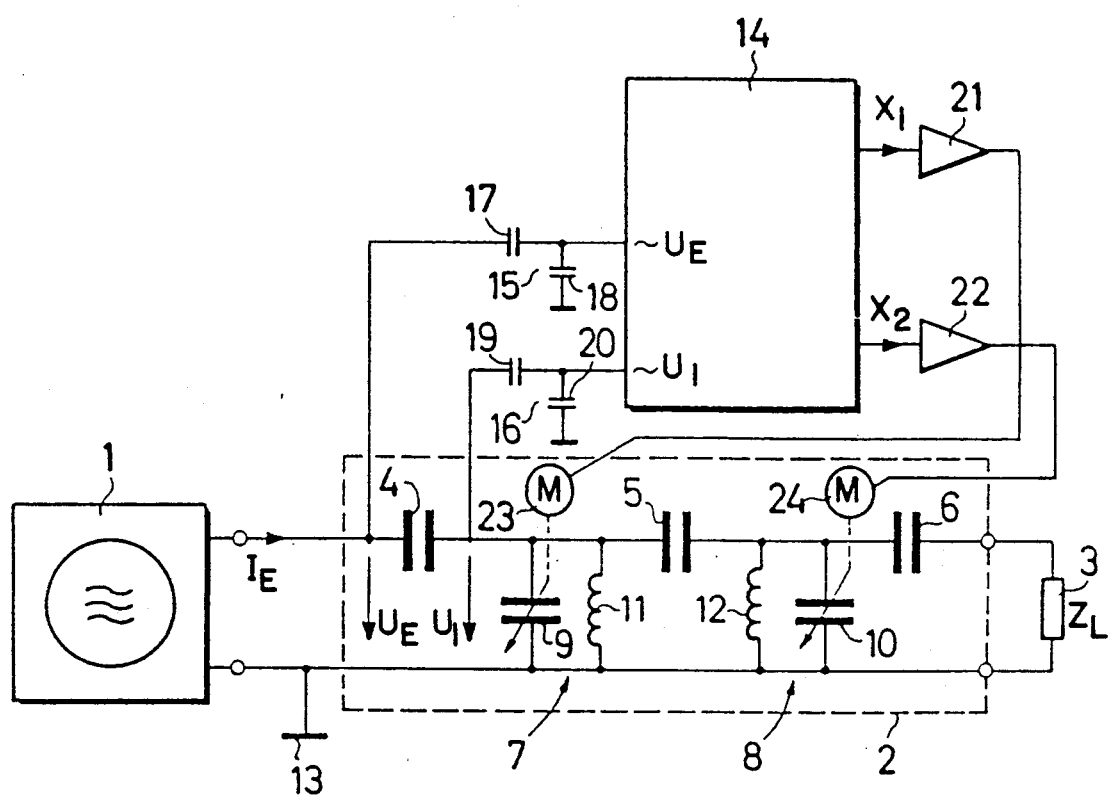

United States Patent [19]

Gesche et al.

[11] Patent Number: 5,053,725
[45] Date of Patent: Oct. 1, 1991

[54] CIRCUIT CONFIGURATION FOR THE AUTOMATIC TUNING OF A MATCHING NETWORK

[75] Inventors: Roland Gesche, Seligenstadt; Stefan Locher, Alzenau, both of Fed. Rep. of Germany

[73] Assignee: Leybold AG, Hanau, Fed. Rep. of Germany

[21] Appl. No.: 413,777

[22] Filed: Sep. 28, 1989

[30] Foreign Application Priority Data

Jul. 18, 1989 [DE] Fed. Rep. of Germany ....... 3923662

[51] Int. Cl.$^5$ ............................................. H03H 11/30
[52] U.S. Cl. ..................................... 333/17.3; 333/33
[58] Field of Search ................ 333/17.3; 455/123, 125

[56] References Cited

U.S. PATENT DOCUMENTS

| | | | |
|---|---|---|---|
| 3,743,974 | 7/1973 | Sheffield | 333/17.3 X |
| 3,919,644 | 11/1975 | Smolka | 333/17.3 X |
| 4,112,395 | 9/1978 | Seward | 333/17.3 |
| 4,207,137 | 6/1980 | Tretola | |
| 4,679,007 | 7/1987 | Reese et al. | 333/17.3 |

FOREIGN PATENT DOCUMENTS

| | | |
|---|---|---|
| 19157609-35 | 7/1976 | Fed. Rep. of Germany . |
| 3638880A1 | 5/1987 | Fed. Rep. of Germany . |
| 3821208C1 | 11/1989 | Fed. Rep. of Germany . |

OTHER PUBLICATIONS

Solid State Technology, Apr. 1983, p. 79, "Dual Reactor In-Line Plasma System".
Solid State Science, May 1967, pp. 505-508, "Deposition of Tantalum and Tantalum Oxide by Superimposed RF and D-C Sputtering".

Primary Examiner—Paul Gensler
Attorney, Agent, or Firm—Willian Brinks Olds Hofer Gilson & Lione

[57] ABSTRACT

The invention relates to a circuit configuration for the automatic tuning of a matching network (2) disposed between an electrical energy source (1) and a load (3). Herein two measured signals ($U_E$, $U_1$) are received from which are formed the magnitudes of three signals ($U_E$, $U_1$, $I_E$) from which, in turn, the control values $x_1$, $x_2$ are determined for the setting of the matching network (2).

21 Claims, 2 Drawing Sheets

CIRCUIT CONFIGURATION FOR THE AUTOMATIC TUNING OF A MATCHING NETWORK

In installations for applying and removing thin layers of a variety of materials the generation of thin plasma layers by means of high frequency has found widespread use. Therein the variable impedance of the plasma must be transformed to the fixed load impedance of a 13.56 MHz high-frequency generator which is for example 50 Ohms. Matching networks are customarily used for this purpose which are disposed between the high-frequency generator and the plasma path. These matching networks possess variable coils and/or capacitors which are adjusted manually to carry out the matching.

Since the manual setting of the capacitances or inductances at the capacitors or coils is cumbersome, automatic matching networks have already been suggested. When realizing these networks, however, various problems are encountered which can only be solved with difficulty. For example, a transducer is required with which a complex impedance can be measured at high power. These transducers known from the field of vectorial high-frequency measuring technology are very expensive and in the power range occurring in plasma coating currently not available. In particular, the current measurement presents problems herein. The use of directional couplers is likewise eliminated because the frequency of 13.56 MHz is too low for this purpose.

It is also conceivable to measure the plasma impedance itself and to calculate therefrom the necessary adjustment of the capacitances or inductances. Measurement of the plasma impedance, however, carries with it even more problems than measuring the input impedance of the matching network, since through the power and impedance range the requirements made of the measuring accuracy and dynamics become extremely high. In addition, for the calculation a numerical expenditure of a not inconsiderable degree would be necessary.

For the reasons mentioned, in general the input impedance is measured and used directly for the regulation. However, since the characteristic families are a function of the plasma impedance, the regulation response is likewise a function of the plasma impedance. Added to this is the fact that the characteristic families are also not unique, which is the reason why the regulators do not function at all at some plasma impedances. Characteristic families are generally defined as a series of graphic relationships between two values that characterize the behavior of a device, circuit or apparatus. These relationships are usually plotted in the form of families or graphs or characteristic curves relating the currents obtained to the voltages applied for a range of operating conditions.

The invention is therefore based on the task of measuring in a simple manner the input impedance of a matching circuit for a variable load impedance and using it for purposes of regulation.

This task is solved according to the features of Claim 1.

The advantage achieved with the invention consists in particular in that only two voltages are measured and a signal proportional to the current is formed from the voltage difference, whereby no direct current measurement is required. Furthermore, the control values are formed from the magnitude of the three signals so that phase measurements become superfluous. Thereby a cost-effective and reliable structure of the transducer and the evaluation circuit becomes possible. Moreover, the regulation takes place largely independently of the amplitude.

Figure 2:
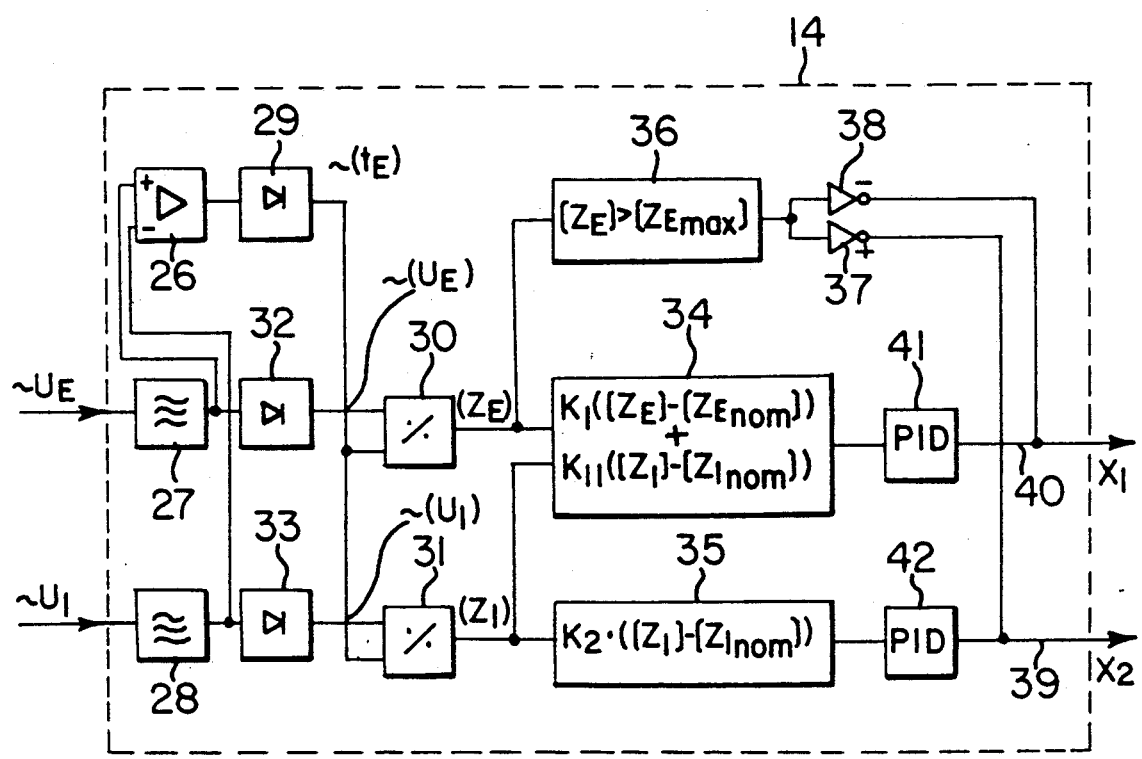

An embodiment example of the invention is represented in the drawing and is described in detail below. Therein:

FIG. 1 represents a matching circuit for a variable load impedance with an associated control circuit; and FIG. 2 a configuration for the generation of regulating control values from the measured values.

In FIG. 1 a high frequency generator 1 is shown which oscillates at a frequency of 13.56 MHz and is connected via a matching network 2 with a variable load impedance 3. The matching network 2 has three capacitors 4, 5, 6 in the series arm and two parallel resonant circuits 7, 8 in the shunt arm. These resonant circuits 7, 8 each comprise a variable capacitor 9 or 10 and a fixed coil 11 or 12, wherein the resonant circuit 8 is connected with its one terminal to ground 13 and with its other terminal between the capacitors 5 and 6, while the other resonant circuit 7 is likewise connected with its one terminal to ground 13 but with its other terminal connected with the capacitors 4 and 5.

In the matching circuit 2 two different values are tapped and supplied to a control and calculating unit 14. These values are the voltage $U_E$ which appears at the output of the high-frequency generator 1, as well as the voltage $U_1$ which appears at the parallel resonant circuit 7. These voltages $U_E$ and $U_1$ are supplied via capacitive voltage dividers 15, 16 which each comprise two capacitors 17, 18 or 19, 20, to the control unit 14 which outputs the two control values $x_1$ and $x_2$. These control values $x_1$ and $x_2$ are amplified in amplifiers 21, 22 and supplied to setting motors 23, 24 which carry out an adjustment of the capacitors 9 or 10. The capacitors 9, 10 are therein set so that the matching network 2 always assumes an impedance value $Z_{Enom}$ corresponding to the internal resistance of the high-frequency generator. In the event of matching $Z_E$ must be real and be 50 Ohms. Therefrom the matching condition for $Z_{1nom}$ results, hence the impedance value which is to occur at $U_1$, of 50 Ohms minus the impedance of the fixed capacitor 4. Since this is complex, the magnitudes (i.e., sign-independent absolute values) of the two impedances provide a statement about the real and imaginary part of the reflection factor or the input impedance.

In FIG. 2 the fundamental operating mechanism of the control unit 14 is shown in detail. It is evident that the signals $\sim U_E$ and $\sim U_1$ are each supplied to a bandpass filter 27, 28. The transfer functions of these filters 27, 28 and the transfer functions of the voltage dividers 15, 16 are herein in phase which can readily be carried out by an appropriate adjustment. The output signals of the two bandpass filters 27 and 28 are placed on a subtractor 26 which is followed by a rectifier 29 whose output signal is supplied to two dividers 30, 31. Furthermore, the output signal of the bandpass filter 27 is supplied to a rectifier 32 whose output is connected with a second input of the divider 30. The output signal of the bandpass filter 28 reaches moreover via a rectifier 33 to a second input of the divider 31 whose output signal, in turn, is supplied to two control-value formers 34 and 35. To a third control-value former (or threshold recognizer) 36 only the output signal of divider 30 is supplied. The output signal of this control-value former 36 is supplied to a normal amplifier 37 and to an inverting amplifier 38 and from there supplied to an output 39 and 40 respectively. In contrast, the output signals of the control-value formers 34, 35 are supplied via each a PID (Proportional Integral Differentiating controller 41 and 42 respectively to the outputs 40 and 39 respectively. At these outputs 39, 40 subsequently the control values $x_2$, $X_1$ appear which are given to the setting motors 23, 24 as shown in FIG. 1.

The DC current signal, which comes from the rectifier 32 and is proportional to the magnitude of the input voltage $U_E$, is divided in the divider 30 by a DC current signal which is proportional to the magnitude of the input current $I_E$. Hereby at the output of the divider 30 a signal $|Z_E|$ is obtained which corresponds to the magnitude of the input impedance. In analogous manner the signal which is proportional to the magnitude of voltage $U_1$ is divided in divider 31 by the signal which is proportional to the magnitude of the input current $I_E$. At the output of divider 31 therefore a signal $|Z_1|$ appears which corresponds to the magnitude of an impedance which corresponds to the difference of the input impedance minus the impedance of the capacitor 4. By determining the impedances $|Z_E|$ and $|Z_1|$ the regulation becomes largely independent of the amplitude.

In the control-value formers 34, 35 the impedance signals $|Z_E|$ and $|Z_1|$ are further processed and specifically in the control-value former 34 the difference between $|Z_E|$ and a nominal value of $Z_E$ is formed. This nominal value $|Z_{Enom}|$ corresponds to an input impedance as it occurs in normal operation. The difference between the actual value and the nominal value of $Z_E$ hence indicates a control deviation. The control deviation can be multiplied by a constant factor $K_1$ to be able to further process it better. Moreover, in the control-value former 34 the difference between the impedance $|Z_1|$ and a nominal impedance of $Z_1$ is formed. This difference can be multiplied again with a proportionality factor $K_{11}$. If now the two difference signals are added then a total control deviation is obtained which corresponds to the two individual control deviations. This total control deviation optimizes the control paths. With the aid of the PID controller 41 now the setting motor 23 is tuned which, on the one hand, adjusts the capacitor 9 until the total control deviation in the control-value former 34 is zero.

In the control-value former 15 likewise a difference of nominal and actual value is formed, and specifically between the nominal and actual value of $|Z_1|$ as it was also formed in the control-value former 34 already. But in contrast, here the difference value is multiplied with a proportionality factor $K_2$ however. The control deviation formed in this manner is supplied to the PID controller 42 which drives the setting motor 24. The setting motor 24 thereupon adjusts the capacitor 10 until the control deviation $|Z_1| - |Z_{1nom}|$ becomes zero.

In the control-value former 36 it is determined whether the magnitude of the input impedance $|Z_E|$ is greater than a predetermined maximum value of this input impedance. If this is the case, then the PID controllers 41, 42 afflicted with a relatively large time constant are so to speak overtaken by the signals from the control-value former 36, i.e. a priority setting of capacitors 9 and 10 is carried out, and specifically in the sense that the capacitor 9 is brought down to smaller capacitance values and capacitor 10 brought up to greater capacitance values. The opposite driving of the two capacitors 9 and 10 is brought about by the amplifiers 37, 38 whose output signals have inverted signs.

The dependence of the impedances $Z_E$ and $Z_1$ on the changes of the setting of capacitors 9, 10 is not orthogonal, i.e. the changes of even only one of these capacitors 9, 10 changes both impedances $Z_E$ and $Z_1$. To determine the capacitor setting speed at which the matching point is reached on the shortest path, it is possible to place in the characteristic family diagram a straight line from the nominal position through the matching point. Each impedance deviation would then be reflected as a linear combination of capacitor speeds. Since the characteristic family diagrams are not linear however, and furthermore are a function of the load impedance 3, such an approach would be cumbersome and expensive. From characteristic family diagrams for different load impedances and simulation calculations it was found that a favorable compromise is achieved if the control value $X_1$ for capacitor 9 is formed from the superposition of both control deviations in the control-value former 34, while the control value $x_2$ of the capacitor 10 is derived directly from $Z_1$ and generated in the control-value former 35. Since this compromise does not cover all states, the control-value former 36 was provided which prevents on exceeding a limit of $Z_E$ that the regulator becomes stranded in a corner of the setting range.

The nominal impedance $Z_E$ is 50 Ohms real while the nominal impedance $Z_1$ is complex. Since the magnitudes of the actual impedances are formed, these must be compared with the magnitudes of the nominal impedances. For that reason the impedances in FIG. 2 are provided with magnitude bars.

We claim:

1. A circuit configuration for the automatic tuning of a matching network (2), the matching network (2) being located between an electrical energy source (1) and a load (3), the matching network (2) further having adjustable reactances (9, 10), the circuit configuration comprising:

a first measurement point in the matching network (2);

a second measurement point in the matching network (2);

means for tapping a first electrical signal ($U_E$) at said first measurement point;

means for tapping a second electrical signal ($U_1$) at said second measurement point;

means for supplying said first electrical signal ($U_E$) and said second electrical signal ($U_1$) to a control and calculating unit (14);

electrical means (4) for creating a third electrical signal (I), said electrical means (4) being located between said first measurement point and said second measurement point;

said third electrical signal (I) being calculated in said control and calculating unit (14) from said first electrical signal ($U_E$) and said second electrical signal ($U_1$);

means in said control and calculating unit for forming the absolute value of said first electrical signal ($|U_E|$), the absolute value of said second electrical signal ($|U_1|$) and the absolute value of said third electrical signal ($|I|$);

further means in said control and calculating unit for creating at least one impedance value ($Z_E$, $Z_1$) from the absolute value of said first electrical signal ($|U_E|$), the absolute value of said second electrical signal ($|U_1|$) and the absolute value of said third electrical signal ($|I|$); and means for comparison of said at least one impedance value with a predetermined ideal value for said at least one impedance value, the result of said comparison means for being used to set the reactances of the matching network (2).

2. The circuit configuration defined in claim 1 wherein said first electrical signal is an input voltage ($U_E$) of the matching network (2).

3. The circuit configuration defined in claim 1 wherein said second electrical signal is a voltage ($U_1$).

4. The circuit configuration defined in claim 1 wherein:
said first electrical signal is an input voltage ($U_E$) of the matching network (2);
said second electrical signal is a voltage ($U_1$);
said third electrical signal is an input current ($I_E$) of the matching network (2); and
said input current ($I_E$) is determined by calculating the difference between said input voltage ($U_E$) and said voltage ($U_1$) measured at said second measurement point.

5. The circuit configuration defined in claim 1 wherein said control and calculating unit (14) drives setting motors (23, 24) which adjust said adjustable reactances (9, 10).

6. The circuit configuration defined in claim 2 wherein said input voltage ($U_E$) is input to a first capacitive receiver (15) and then supplied in said control and calculating unit via a first bandpass filter (27) and a first rectifier (32) to a first divider (30).

7. The circuit configuration defined in claim 3 wherein said second electrical signal ($U_1$) is input to a second capacitive receiver (16) and then supplied in said control and calculating unit via a second bandpass filter (28) and a second rectifier (33) to a second divider (31).

8. The circuit configuration defined in claim 4 wherein the difference between said first electrical signal ($U_E$) and said second electrical signal ($U_1$) is formed in said control and calculating unit by a subtractor (26) and supplied via a rectifier (29) to a first divider (30) and to a second divider (31).

9. The circuit configuration defined in claims 6 or 8 wherein said first divider (30) forms the absolute value of one of said at least one impedance ($|Z_E|$) as a quotient from the absolute value of said first electrical signal ($|U_E|$) and the absolute value of said third electrical signal ($|I_E|$).

10. The circuit configuration defined in claims 7 or 8 wherein said second divider (31) forms the absolute value of a second of said at least one impedance ($|Z_1|$) from the absolute value of said second electrical signal ($|U_1|$) and the absolute value of said third electrical signal ($|I_E|$).

11. The circuit configuration defined in claim 9 wherein a first control-value former (34) is provided which forms the difference between the absolute value of said one of said at least one impedance and the absolute value of a predetermined ideal value for said one of said at least one impedance.

12. The circuit configuration defined in claim 10 wherein a second control-value former (35) is provided which forms the difference between the absolute value of said second of said at least one impedance and the absolute value of a predetermined ideal value for said second of said at least one impedance.

13. The circuit configuration defined in claim 9 wherein a first control-value former (34) is provided which forms the difference between the absolute value of a second of said at least one impedance and the absolute value of a predetermined value for said second of said at least one impedance.

14. The circuit configuration defined in claim 10 wherein a second control-value former (35) is provided which forms the difference between the absolute value of one of said at least one impedance and the absolute value of a predetermined ideal value for said one of said at least one impedance.

15. The circuit configuration defined in claim 11 wherein said first control-value former (34) also forms the difference between the absolute value of a second of said at least one impedance and the absolute value of a predetermined value for said second one of said at least one impedance.

16. The circuit configuration defined in claim 9 wherein the absolute value of said one of said at least one impedance ($|Z_E|$) is supplied to a threshold recognizer (36) which, upon detecting the absolute value of said one of said at least one impedance exceeding the absolute value of a predetermined ideal value for said one of said at least one impedance, sets said adjustable reactances (9, 10) of the matching network (2) directly.

17. The circuit configuration defined in claim 11 wherein output signals from said first control-value former (34) and a second control-value former (35) are input to one of a plurality of PID controllers (41, 42) each of which sets one of a plurality of said adjustable reactances (9, 10) of the matching network (2).

18. The circuit configuration defined in claim 10 wherein output signals from said second control-value former (35) and a first control-value former (34) are input to one of a plurality of PID controllers (41, 42) each of which sets one of a plurality of said adjustable reactances (9, 10) of the matching network (2).

19. The circuit configuration defined in claim 13 wherein output signals from said first control-value former (34) and a second control-value former (35) are input to one of a plurality of PID controllers (41, 42) each of which sets one of a plurality of said adjustable reactances (9, 10) of the matching network (2).

20. The circuit configuration defined in claim 16 wherein the value of one (9) of said capacitors (9, 10) is decreased and the value of another (10) of said capacitors (9, 10) is increased.

21. The circuit configuration defined in claim 1 wherein the load is plasma.

* * * * *

UNITED STATES PATENT AND TRADEMARK OFFICE
CERTIFICATE OF CORRECTION

PATENT NO. : 5,053,725
DATED : October 1, 1991
INVENTOR(S) : Roland Gesche et al.

It is certified that error appears in the above-identified patent and that said Letters Patent is hereby corrected as shown below:

In column 1, line 55, before "graphs" please delete "or" and substitute therefor --of--.

In column 3, line 5, after "Differentiating" please insert --)--.

In column 3, line 48, before "likewise" please delete "15" and substitute therefor --35--.

Signed and Sealed this

Twenty-first Day of December, 1993

BRUCE LEHMAN

*Attest:*

*Attesting Officer*          Commissioner of Patents and Trademarks